United States Patent
Li (10) Patent No.: US 11,393,829 B2
(45) Date of Patent: Jul. 19, 2022

(54) SEMICONDUCTOR STRUCTURE, STATIC RANDOM ACCESS MEMORY AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Yong Li, Shanghai (CN)

(73) Assignees: Semiconductor Manufacturing International (Shanghai) Corporation, Shanghai (CN); Semiconductor Manufacturing International (Beijing) Corporation, Beijing (CN)

(*) Notice: Subject to any disclaimer, the term of this patent is extended or adjusted under 35 U.S.C. 154(b) by 55 days.

(21) Appl. No.: 16/870,044

(22) Filed: May 8, 2020

(65) Prior Publication Data

US 2020/0266201 A1    Aug. 20, 2020

Related U.S. Application Data

(62) Division of application No. 15/811,146, filed on Nov. 13, 2017, now Pat. No. 10,685,965.

(30) Foreign Application Priority Data

Nov. 28, 2016    (CN) .......................... 201611065220.8

(51) Int. Cl.
   *H01L 27/11*    (2006.01)
   *H01L 29/66*    (2006.01)
   (Continued)

(52) U.S. Cl.
   CPC ...... *H01L 27/1104* (2013.01); *G11C 11/4023* (2013.01); *H01L 27/0886* (2013.01);
   (Continued)

(58) Field of Classification Search
   None
   See application file for complete search history.

(56) References Cited

U.S. PATENT DOCUMENTS

| 6,576,521 | B1 | 6/2003 | Chaudhry et al. |
| 2004/0036127 | A1 | 2/2004 | Chau et al. |
| 2007/0238273 | A1 | 10/2007 | Doyle et al. |
| 2009/0263949 | A1 | 10/2009 | Anderson et al. |

(Continued)

FOREIGN PATENT DOCUMENTS

| CN | 101002328 A | 7/2007 |
| CN | 104576536 A | 4/2015 |

OTHER PUBLICATIONS

The European Patent Office (EPO) The Extended European Search Report for 17202701.3 dated Apr. 19, 2018 13 Pages.

(Continued)

*Primary Examiner* — Bo B Jang
(74) *Attorney, Agent, or Firm* — Anova Law Group, PLLC (57) ABSTRACT

A semiconductor structure and a static random access memory are provided. The semiconductor structure includes a base substrate. The base substrate includes a substrate and a plurality of discrete fins on the substrate. The substrate includes a pass gate transistor region. The semiconductor structure further includes a gate structure, across a length portion of each fin, covering top and sidewall surfaces of each fin, and on each fin, and pass gate doped regions in the fin on both sides of the gate structure in the pass gate transistor region. At least one of the pass gate doped regions on one side of the gate structure is a non-epitaxial layer doped region in the fin.

12 Claims, 8 Drawing Sheets

(51) Int. Cl.

| | | |
|---|---|---|
| *H01L 27/092* | (2006.01) | |
| *H01L 29/78* | (2006.01) | |
| *H01L 29/417* | (2006.01) | |
| *H01L 29/165* | (2006.01) | |
| *H01L 29/08* | (2006.01) | |
| *G11C 11/402* | (2006.01) | |
| *H01L 27/088* | (2006.01) | |
| *H01L 27/105* | (2006.01) | |
| *H01L 21/8234* | (2006.01) | |

(52) U.S. Cl.
CPC ...... *H01L 27/0924* (2013.01); *H01L 27/1052* (2013.01); *H01L 29/0847* (2013.01); *H01L 29/165* (2013.01); *H01L 29/41791* (2013.01); *H01L 29/66795* (2013.01); *H01L 29/7851* (2013.01); *H01L 21/823418* (2013.01); *H01L 21/823431* (2013.01)

(56) References Cited

U.S. PATENT DOCUMENTS

| | | |
|---|---|---|
| 2010/0006945 A1 | 1/2010 | Merelle et al. |
| 2011/0171795 A1 | 7/2011 | Tsai et al. |
| 2013/0095629 A1 | 4/2013 | Ando et al. |
| 2013/0200470 A1 | 8/2013 | Liu et al. |
| 2014/0252477 A1 | 9/2014 | Tseng et al. |
| 2015/0102423 A1 | 4/2015 | Xie |
| 2015/0214364 A1 | 7/2015 | Chan et al. |

OTHER PUBLICATIONS

The European Patent Office (EPO) The Extended European Search Report for 17202701.3 dated Jul. 20, 2018 14 Pages.

Farshad Moradi et al: "Asymmetrically Doped FinFETs for Low-Power Robust SRAMs", IEEE Transactions on Electron Devices, IEEE Service Center, Piscataway, NJ, US, vol. 58, No. 12, Dec. 1, 2011 (Dec. 1, 2011), p. 4241-4249, XP01136496, ISSN: 0018-9383, DOI: 10.1109/TED. 2011.2169678.

SEMICONDUCTOR STRUCTURE, STATIC RANDOM ACCESS MEMORY AND FABRICATION METHOD THEREOF

CROSS-REFERENCES TO RELATED APPLICATIONS

This application is a divisional of U.S. patent application Ser. No. 15/811,146, filed on Nov. 13, 2017, which the priority of Chinese patent application No. 201611065220.8, filed on Nov. 28, 2016, the entirety of which is incorporated herein by reference.

FIELD OF THE DISCLOSURE

The present disclosure generally relates to the field of semiconductor technology and, more particularly, relates to a semiconductor structure, static random access memory and fabrication method thereof.

BACKGROUND

In the current semiconductor industry, integrated circuit products can be divided into three main categories: logic, memory and analog circuit. Among them, memory device accounted for a large proportion of the integrated circuit products. With the development of semiconductor technology and wide applications of the memory device, the memory device and other devices need to be simultaneously formed on a single chip to form an embedded semiconductor memory. For example, to embed the memory device in a central processing unit, the memory device needs to be compatible with a platform of the embedded central processing unit, while the specifications and the corresponding electrical performance of the original memory device still need to be maintained.

In general, the memory device needs to be compatible with an embedded standard logic device. For example, an embedded semiconductor device usually includes a logic region and a memory region. The logic region usually includes a logic device, and the memory region usually includes a memory device. With the development of memory technology, various types of semiconductor memories have emerged, including static random access memory (SRAM), dynamic random access memory (DRAM), erasable programmable read-only memory (EPROM), electrically erasable programmable read-only memory (EEPROM), and flash memory (Flash). Because the SRAM has advantages of low power consumption and fast operating speed, the SRAM and fabrication method thereof are attracting more and more attention.

However, it is desirable to improve the performance of the SRAM in a semiconductor device and thus to improve the overall performance of the semiconductor device. The disclosed device structures and methods are directed to solve one or more problems set forth above and other problems.

BRIEF SUMMARY OF THE DISCLOSURE

One aspect of the present disclosure includes a method for fabricating a semiconductor structure. The method includes providing a base substrate including a substrate and a plurality of discrete fins on the substrate. The substrate includes a pass gate transistor region. The method also includes forming a gate structure across a length portion of each fin, covering top and sidewall surfaces of each fin, and on each fin. Further, the method includes forming pass gate doped regions in the fin on both sides of the gate structure in the pass gate transistor region. At least one of the pass gate doped regions is formed by performing an ion-doped non-epitaxial layer process on the fin.

Another aspect of the present disclosure includes a semiconductor structure. The semiconductor structure includes a base substrate, including a substrate and a plurality of discrete fins on the substrate. The substrate includes a pass gate transistor region. The semiconductor structure also includes a gate structure, across a length portion of each fin, covering top and sidewall surfaces of each fin, and on each fin. Further, the semiconductor structure includes pass gate doped regions in the fin on both sides of the gate structure in the pass gate transistor region. At least one of the pass gate doped regions on one side of the gate structure is a non-epitaxial layer doped region in the fin.

Another aspect of the present disclosure includes a static random access memory. The static random access memory includes a semiconductor structure. The semiconductor structure includes a base substrate, including a substrate and a plurality of discrete fins on the substrate. The substrate includes a pass gate transistor region. The semiconductor structure also includes a gate structure, across a length portion of each fin, covering top and sidewall surfaces of each fin, and on each fin. Further, the semiconductor structure includes pass gate doped regions in the fin on both sides of the gate structure in the pass gate transistor region. At least one of the pass gate doped regions on one side of the gate structure is a non-epitaxial layer doped region in the fin.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or the alike parts.

A SRAM mainly includes a pull-up (PU) transistor, a pull-down (PD) transistor, and a pass gate (PG) transistor. Read margin of a memory plays a key role in the performance of the memory. If the read margin performance of the memory can be improved, the performance and yield of the memory will be improved, and the overall performance of a semiconductor device will be improved accordingly. The read margin of the memory is proportional to a beta ratio, and the beta ratio is a ratio of an on-current ($I_{on}$) of the pull-down transistor to an on-current of the pass gate transistor.

Therefore, increasing the on-current of the pull-down transistor or reducing the on-current of the pass gate transistor, can increase the beta ratio of the memory, such that the read margin of the memory can be improved, and the performance and yield of the memory can be improved.

Figure 14:
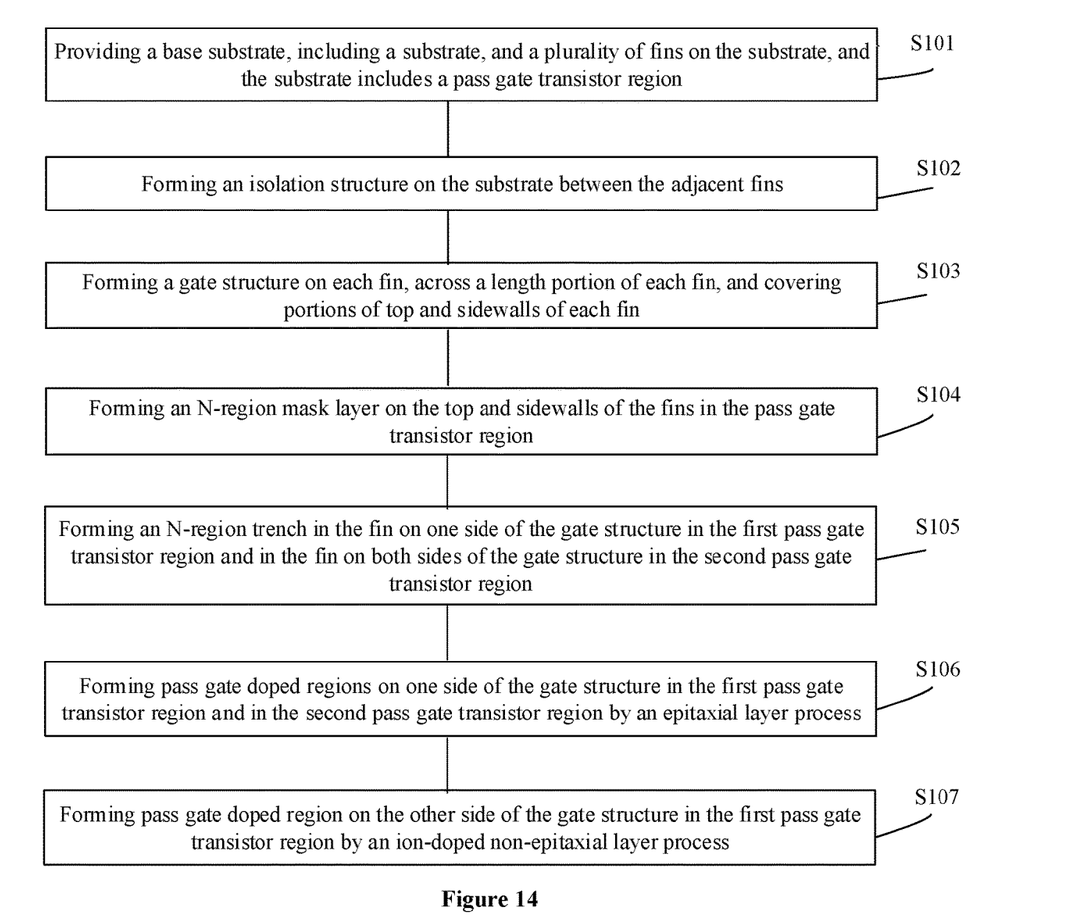
FIG. 14 illustrates an exemplary fabrication method for forming a semiconductor structure consistent with various disclosed embodiments of the present disclosure.

The present disclosure provides a semiconductor structure, SRAM and fabrication method thereof. FIG. 14 illustrates an exemplary fabrication method for forming a semiconductor structure consistent with various disclosed embodiments of the present disclosure; and FIGS. 1-11 illustrate semiconductor structures corresponding to certain stages of the exemplary fabrication method.

Figure 1:
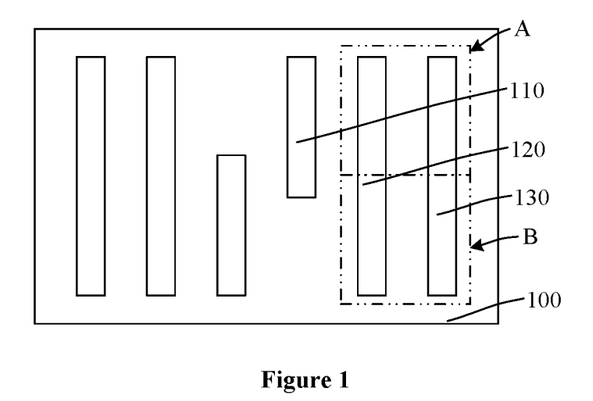
FIGS. 1-11 illustrate semiconductor structures corresponding to certain stages for forming an exemplary semiconductor structure consistent with various disclosed embodiments of the present disclosure.
Figure 2:
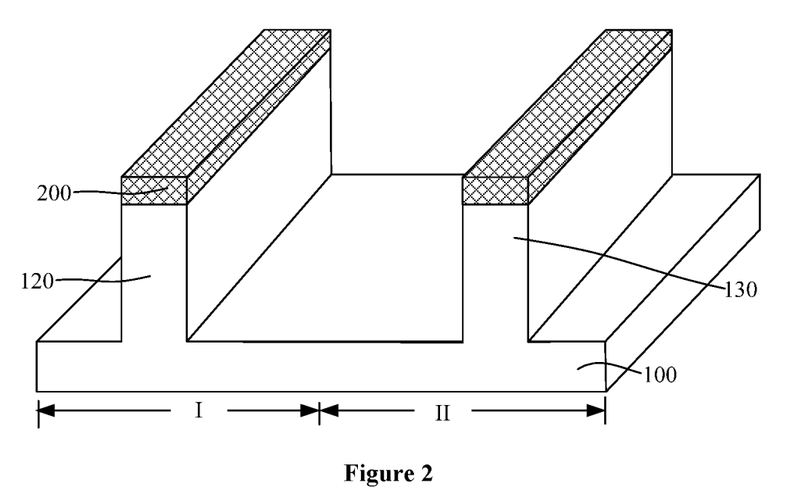

As shown in FIG. 14, at the beginning of the fabrication method, a base substrate with certain structures may be provided (S101). FIGS. 1-2 illustrate corresponding semiconductor structures.

FIG. 1 illustrates a top-view of a portion of the semiconductor structure. FIG. 1 illustrates a substrate and fins. The semiconductor structure may also include other components. FIG. 2 illustrates a perspective view of region 'B' in FIG. 1. Referring to FIG. 1, a base substrate may be provided. In one embodiment, the base substrate may include a substrate 100 and a plurality of discrete fins (not illustrated) on the substrate 100. The substrate 100 may include a pass gate transistor region 'B' as illustrated in FIG. 1.

The substrate may provide a platform for subsequently forming the semiconductor structure. In one embodiment, the base substrate may provide a platform for subsequently forming a SRAM. The SRAM may include a fin field effect transistor (FinFET), thus the substrate 100 may also include a pull-down transistor region 'A' as illustrated in FIG. 1, and a pull-up transistor region (not illustrated). The pull-up transistor region may include a PMOS region, and the pull-down transistor region and the pass gate transistor region may include NMOS regions.

The pass gate transistor region may be used to form a pass gate transistor, the pull-down transistor region may be used to form a pull-down transistor, and the pull-up transistor region may be used to form a pull-up transistor. In one embodiment, the pass gate transistor and the pull-down transistor may be formed on a same, single fin. Therefore, the pass gate transistor region and the pull-down transistor region may be adjacent regions along a length direction of the fin.

To improve a device current of the SRAM cell region, the pass gate transistor region may include a first pass gate transistor region I and a second pass gate transistor region II, adjacent to each other along a direction perpendicular to the length direction of fin. The first pass gate transistor region I may be used to form a first pass gate transistor, and the second pass gate transistor region II may be used to form a second pass gate transistor. The first pass gate transistor and the second pass gate transistor may form a parallel pass gate transistor. Both the first pass gate transistor region I and the second pass gate transistor region II may include NMOS regions.

Therefore, in one embodiment, a fin may be formed on the substrate 100 in the first pass gate transistor region I, and another fin may be formed on the substrate 100 in the second pass gate transistor region II.

In one embodiment, the fin on the substrate 100 in the pull-up transistor region may be referred to a first fin 110. The fin on the substrate 100 in the first pass gate transistor region I may be referred to a second fin 120. The fin on the substrate 100 in the second pass gate transistor region II may be referred to a third fin 130.

Because the formed pass gate transistor and the pull-down transistor are formed on the same, single fin, the pull-down transistor region may also include a first pull-down transistor region (not illustrated) and a second pull-down transistor region (not illustrated), adjacent to each other along the direction perpendicular to the length direction of the fin. The first pull-down transistor region may be used to form a first pull-down transistor, and the second pull-down transistor region may be used to form a second pull-down transistor. The first pull-down transistor and the second pull-down transistor may form a parallel pull-down transistor. Both the first pull-down transistor region and the second pull-down transistor region may include NMOS regions.

In one embodiment, along the length direction of the fin, the second fin 120 may be across the first pass gate transistor region I and the first pull-down transistor region, and the third fin 130 may be across the second pass gate transistor region II and the second pull-down transistor region.

In one embodiment, the substrate 100 may be a silicon substrate. In certain embodiments, the substrate may be made of germanium, silicon germanium, silicon carbide, gallium arsenide, or indium gallium. The substrate may also be a silicon on insulator (SOI) substrate, a germanium on insulator (GOI) substrate, a glass substrate, or Group III-V compounds substrates, such as a gallium arsenide (GaAs) substrate, or a gallium nitride (GaN) substrate, etc.

The fins may be made of the same material as the substrate 100. In one embodiment, the fins may be made of silicon. In other words, the first fin 110, the second fin 120, and the third fin 130 may be made of silicon. In certain embodiments, the fins may be made of germanium, silicon germanium, silicon carbide, gallium arsenide, or indium gallium, etc.

In one embodiment, forming the substrate 100 and the fins may include: providing an initial substrate; forming a patterned first hard mask layer 200 on the initial substrate; and etching the initial substrate by using the first hard mask layer 200 as a mask to form the substrate 100 and the fins protruding on the substrate 100.

In one embodiment, the first hard mask layer 200 on the top of the fins may be retained after forming the substrate 100 and the fins. The first hard mask layer 200 may be made of silicon nitride. The first hard mask layer 200 may be used to define a stop position of a planarization process and to protect the top of the fins when subsequently performing the planarization process.

Figure 3:
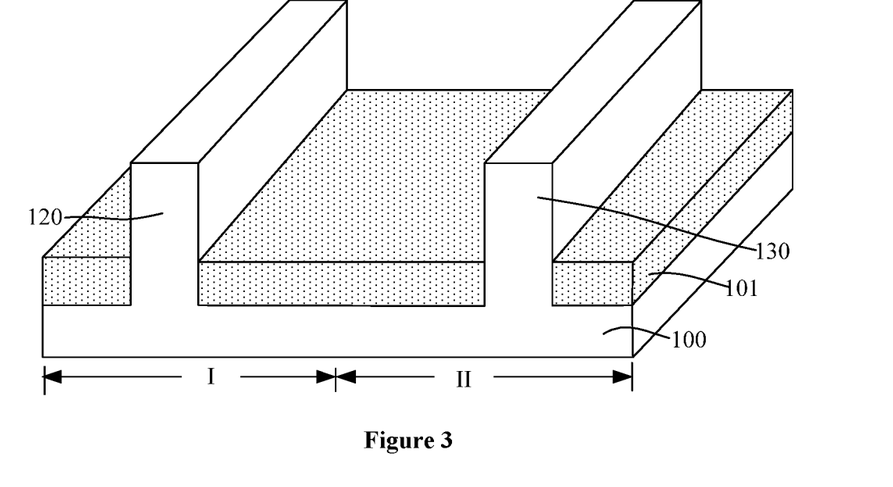

Returning to FIG. 14, after forming the base substrate, an isolation structure may be formed (S102). FIG. 3 illustrates a corresponding semiconductor structure.

FIG. 3 illustrates a perspective view based on FIG. 2. Referring to FIG. 3, after providing the base substrate, an isolation structure 101 may be formed on the substrate 100 between the adjacent fins. The isolation structure 101 may cover portions of sidewalls of the fins, and top of the isolation structure 101 may be lower than top of the fins.

The isolation structure 101 serving as an isolation structure of the semiconductor structure may be used to isolate adjacent devices. In one embodiment, the isolation structure 101 may be made of silicon oxide. In certain embodiments, the isolation structure may be made of silicon nitride, or silicon oxynitride, etc.

In one embodiment, a method for forming the isolation structure 101 may include: filling an isolation material on the substrate 100 between the adjacent fins, where top of the isolation material may be above top of the first hard mask layer 200 (illustrated in FIG. 2); polishing to remove the isolation material above the top of the first hard mask layer 200 to form an isolation film; back-etching portions of a thickness of the isolation film until the top and portions of the sidewalls of the fins are exposed to form the isolation structure 101; and removing the first hard mask layer 200.

Figure 4:
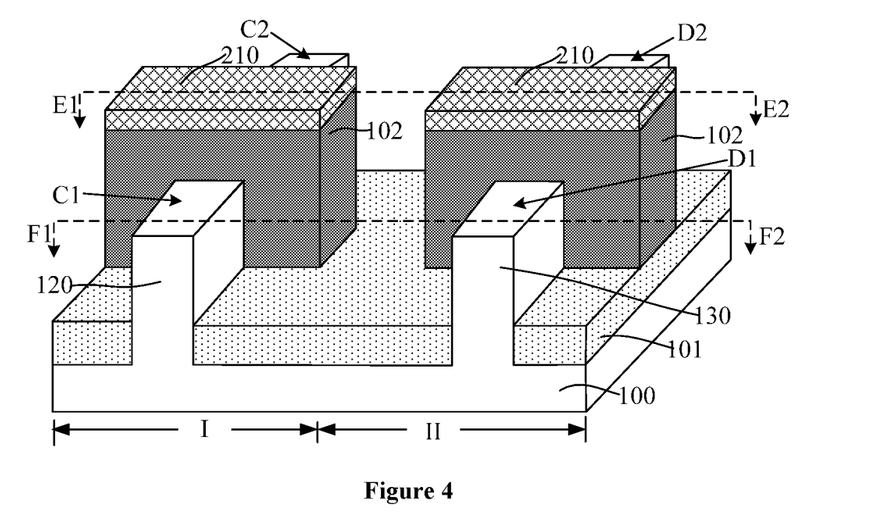

Returning to FIG. 14, after forming the isolation structure, a gate structure may be formed (S103). FIG. 4 illustrates a corresponding semiconductor structure.

Referring to FIG. 4, a gate structure 102 may be formed on each fin, across a length portion of each fin and covering portions of the top and sidewalls of each fin. In one embodiment, the gate structure 102 may be formed on each fin in the pull-up transistor region (not illustrated), the pass gate transistor region 'B' as illustrated in FIG. 1, and the pull-down transistor region 'A' as illustrated in FIG. 1. For example, the gate structure 102 in the pull-up transistor region may be across a length portion of the first fin 110 (illustrated in FIG. 1), and cover portions of the top and sidewalls of the first fin 110. The gate structure 102 in the first pass gate transistor region I and the first pull-down transistor region (not illustrated) may be across a length portion of the second fin 120, and cover portions of the top and sidewalls of the second fin 120. The gate structure 102 in the second pass gate transistor region II and the second pull-down transistor region (not illustrated) may be across a length portion of the third fin 130, and cover portions of the top and sidewalls of the third fin 130.

In one embodiment, a high-K last metal gate last process may be used to form the semiconductor structure, thus the gate structure 102 may be a dummy gate structure. The gate structure 102 may occupy a special location for subsequently forming a real gate structure of the semiconductor structure.

The gate structure 102 may be a single-layer structure, or a stacked structure. The gate structure 102 may include a dummy gate layer; or the gate structure 102 may include a dummy oxide layer and a dummy gate layer on the dummy oxide layer. The dummy gate layer may be made of polysilicon, silicon oxide, silicon nitride, silicon oxynitride, silicon carbide, silicon carbonitride, silicon carboxynitride, or amorphous carbon, etc. The dummy oxide layer may be made of silicon oxide, or silicon oxynitride, etc.

In one embodiment, a method for forming the gate structure 102 may include: forming a dummy gate film on the isolation structure 101, where the dummy gate film may be across a length portion of the fins, and cover portions of the top and sidewalls of the fins; forming a second hard mask layer 210 on the dummy gate film, where the second hard mask layer 210 may define a pattern of the gate structure 102 to be formed; and patterning the dummy gate film by using the second hard mask layer 210 as a mask to form the gate structure 102.

In certain embodiments, the gate structure may be the real gate structure of the subsequently formed semiconductor structure. The gate structure may include a gate dielectric layer and a gate electrode layer on the gate dielectric layer. The gate dielectric layer may be made of silicon oxide, or a high-K gate dielectric material, etc. The gate electrode layer may be made of polysilicon or a metal material, including one or more of Ti, Ta, TiN, TaN, TiAl, TiAlN, Cu, Al, W, Ag and Au.

In one embodiment, after forming the gate structure 102, the second hard mask layer 210 on the top of the gate structure 102 may be retained. The second hard mask layer 210 may be made of silicon nitride. The second hard mask layer 210 may be used to protect the top of the gate structure 102 during subsequent processes. In certain embodiments, the second hard mask layer may be made of silicon oxynitride, silicon carbide, or boron nitride, etc.

Figure 5:
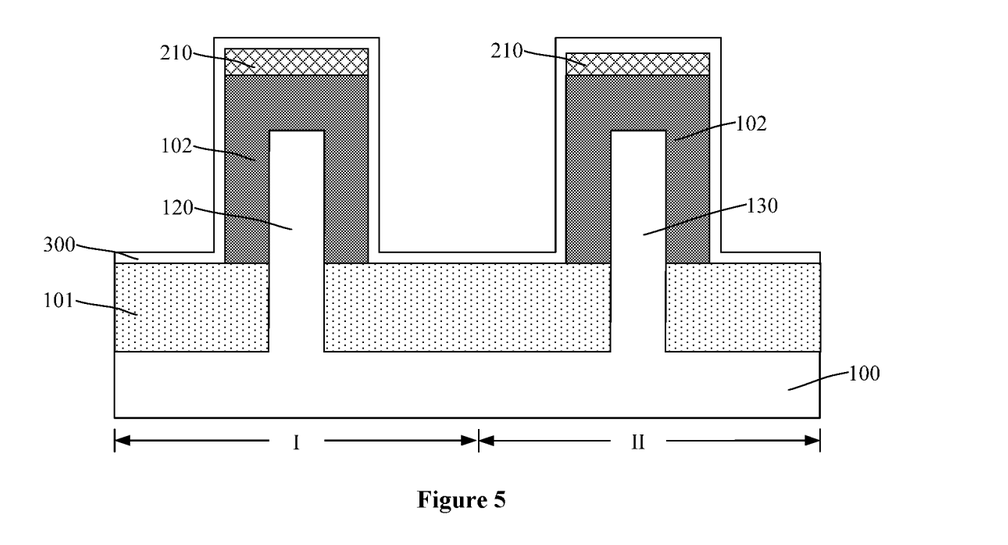
Figure 6:
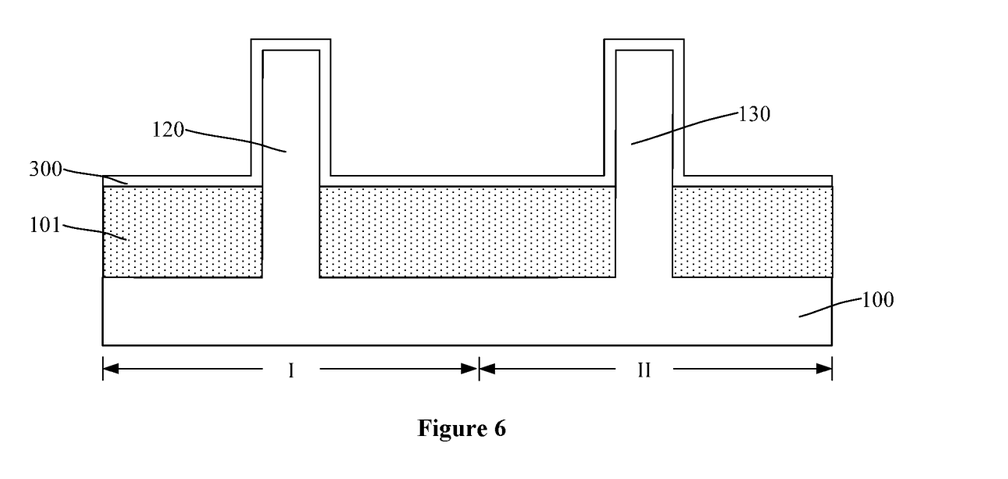

Returning to FIG. 14, after forming the gate structure, an N-region mask layer may be formed (S104). FIGS. 5-6 illustrate a corresponding semiconductor structure.

FIG. 5 illustrates a cross-sectional view along a line 'E1E2' on the basis of FIG. 4, and FIG. 6 illustrates a cross-sectional view along a line 'F1F2' on the basis of FIG. 4. Referring to FIGS. 5-6, an N-region mask layer 300 may be formed on the top and sidewalls of the fins in the pass gate transistor region after forming the gate structure 102 across the length portion of the fins.

In one embodiment, the N-region mask layer 300 may also be formed on top and sidewalls of the gate structure 102 in the pass gate transistor region (illustrated as region 'B' in FIG. 1) and on the isolation structure 101 in the pass gate transistor region.

In one embodiment, to reduce the process difficulty and to save the mask, the N-region mask layer 300 may also cover the pull-up transistor region (not illustrated), and the pull-down transistor region 'A' as illustrated in FIG. 1. The N-region mask layer 300 may also be on the isolation structure 101 in the pull-up transistor region and the pull-down transistor region.

On one hand, the N-region mask layer 300 may be used to protect the sidewalls of the fins from an epitaxial growth process performed on the sidewalls of the first fin 110, the second fin 120 and the third fin 130, when subsequently forming pass gate doped regions by using an epitaxial layer (EPI) process. On the other hand, the N-region mask layer 300 may be used as a mask when subsequently forming the pass gate doped regions, such that a distance between the subsequently formed pass gate doped regions and the channel region may increase via the N-region mask layer 300, and the short channel effect may be improved.

The N-region mask layer 300 may be made of silicon nitride, silicon oxide, boron nitride, or silicon oxynitride, etc. The N-region mask layer 300 may be made of a material different from the fins and the isolation structure 101. In one embodiment, the N-region mask layer 300 may be made of silicon nitride.

The cross-sectional schematics provided in the subsequent fabrication processes are formed on the basis of FIG. 6 unless otherwise specified.

In one embodiment, the following method for forming the pass gate doped regions is described herein as an example, although any suitable methods may be included or used for forming the disclosed pass gate doped regions in accordance with various embodiments of the present disclosure. The epitaxial layer process may be first used to form the pass gate doped regions in the second fin 120 on one side of the gate structure 102 in the first pass gate transistor region I (illustrated as region 'C2' in FIG. 4) and in the third fin 130 on both sides of the gate structure 102 in the second pass gate transistor region II (illustrated as regions 'D1' and 'D2' in FIG. 4); and then an ion-doped non-epitaxial layer process may be used to form the pass gate doped region in the second fin 120 on the other side of the gate structure 102 in the first pass gate transistor region I (illustrated as region 'C1' in FIG. 4).

Figure 7:
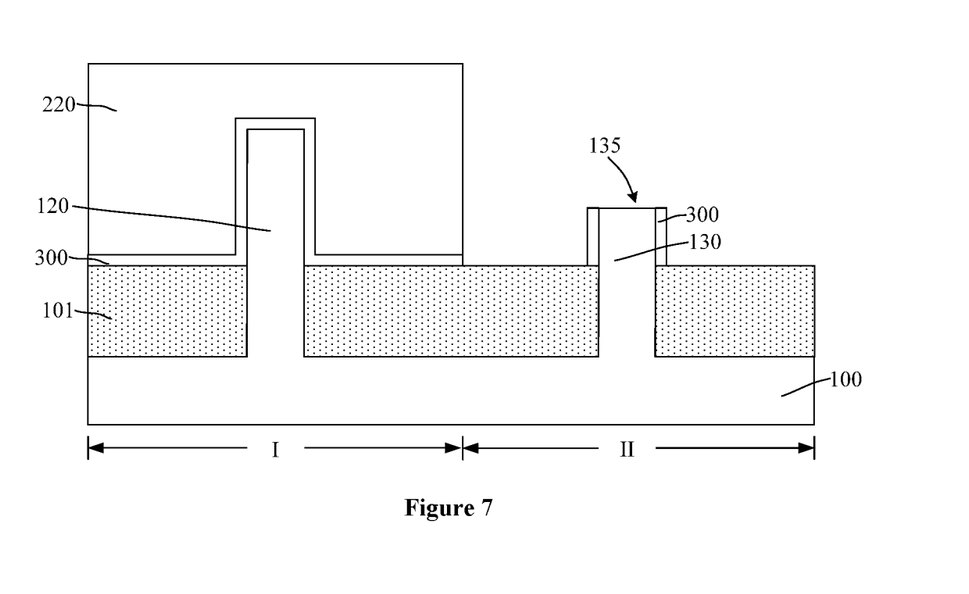

Returning to FIG. 14, after forming the N-region mask layer, an N-region trench may be formed (S105). FIG. 7 illustrates a corresponding semiconductor structure.

Referring to FIG. 7, the N-region mask layer 300 on the top of the second fin 120 on one side of the gate structure 102 in the first pass gate transistor region I (illustrated as region 'C2' in FIG. 4) and on the top of the third fin 130 on both sides of the gate structure 102 in the second pass gate transistor region II (illustrated as regions 'D1' and 'D2' in FIG. 4) may be etched to expose the top surface of the second fin 120 on one side of the gate structure 102 in the first pass gate transistor region I and the top surface of the third fin 130 on both sides of the gate structure 102 in the second pass gate transistor region II. Portions of a thickness of the exposed fins in the first pass gate transistor region I and the second pass gate transistor region II may be etched to form an N-region trench 135 in the second fin 120 on one side of the gate structure 102 in the first pass gate transistor region I and in the third fin 130 on both sides of the gate structure 102 in the second pass gate transistor region II. The N-region trench 135 may provide a spatial location for subsequently forming the pass gate doped regions by performing the epitaxial layer process.

In one embodiment, before etching the N-region mask layer 300, a first patterned layer 220 may be formed to cover the second fin 120 on the other side of the gate structure 102 in the first pass gate transistor region I (illustrated as region 'C1' in FIG. 4). For example, the first patterned layer 220 may cover the N-region mask layer 300 on the other side of the gate structure 102 in the first pass gate transistor region I. The first patterned layer 220 may protect the N-region mask layer 300 on the other side of the gate structure 102 in the first pass gate transistor region I. The first patterned layer 220 may also cover regions, on one side of the gate structure 102 in the first pass gate transistor region I and in the second pass gate transistor region II, that are not expected to be etched.

In one embodiment, the first patterned layer 220 may be made of a photoresist material. After forming the N-region trench 135, the first patterned layer 220 may be removed by a wet process, or an ashing process, etc.

In one embodiment, a dry etching process may be performed to remove the N-region mask layer 300 on the top of the second fin 120 on one side of the gate structure 102 in the first pass gate transistor region I (illustrated as region 'C2' in FIG. 4) and on the top of the third fin 130 on both sides of the gate structure 102 in the second pass gate transistor region II (illustrated as regions 'D1' and 'D2' in FIG. 4). The N-region mask layer 300 on the top of the gate structure 102 and on portions of the isolation structure 101 in the first pass gate transistor region I and the second pass gate transistor region II may also be etched when etching the N-region mask layer 300. After exposing the top of the second fin 120 on one side of the gate structure 102 in the first pass gate transistor region I and the top of the third fin 130 on both sides of the gate structure 102 in the second pass gate transistor region II, portions of a thickness of the second fin 120 and the third fin 130 may continue to be etched to form the N-region trench 135.

In one embodiment, to increase volume of a pass gate epitaxial layer subsequently formed in the N-region trench 135, the N-region mask layer 300 on the sidewalls of the second fin 120 and on the sidewalls of the third fin 130 may also be etched when etching the second fin 120 and the third fin 130. Therefore, after forming the N-region trench 135, the N-region mask layer 300 on the sidewalls of the second fin 120 may be coplanar with the top of the second fin 120, and the N-region mask layer 300 on the sidewalls of the third fin 130 may be coplanar with the top of the third fin 130.

After forming the N-region trench 135, a cleaning process may be performed on the N-region trench 135. The cleaning process may be used not only to remove impurities on the surface of the N-region trench 135, but also to remove an oxide layer (not illustrated) on the surfaces of the second fin 120 and the third fin 130, providing a desired interface state for subsequently forming the pass gate doped regions in the N-region trench 135.

The cleaning solution used in the cleaning process may be a combination of a mixed solution (SC1 solution), including ammonia, hydrogen peroxide and water, and diluted hydrofluoric acid (DHF), or a combination of ozone water, SC1 solution and DHF.

Figure 8:
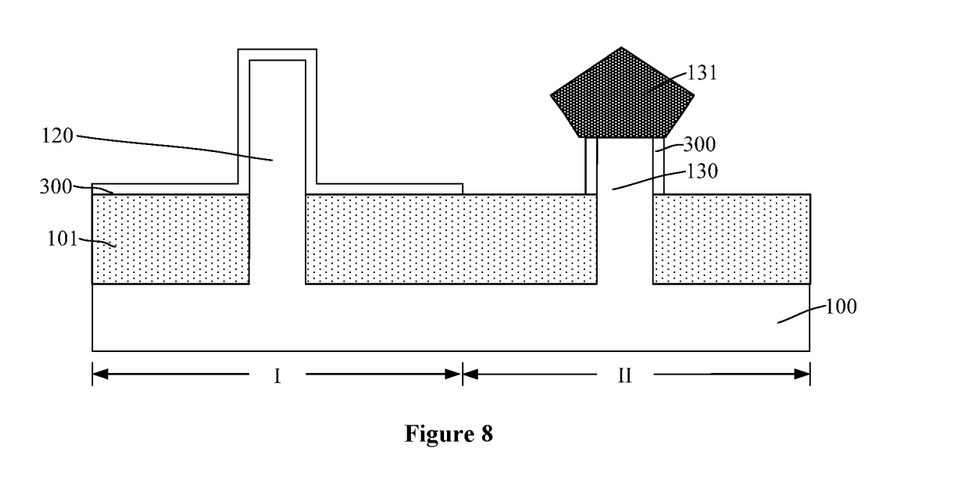
Figure 9:
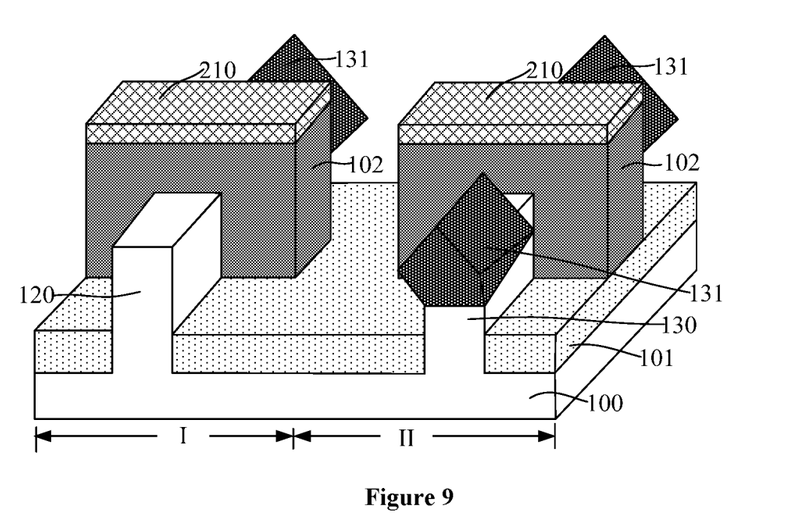

Returning to FIG. 14, after forming the N-region trench, epitaxial layer pass gate doped regions on one side of the gate structure in the first pass gate transistor region and in the second pass gate transistor region may be formed (S106). FIGS. 8-9 illustrate a corresponding semiconductor structure.

FIG. 9 illustrates a perspective view of the semiconductor structure (N-region mask layer not illustrated). Referring to FIGS. 8-9, pass gate epitaxial layers 131 may be formed in the N-region trench 135 (illustrated in FIG. 7), and pass gate doped regions (not illustrated) may be formed in the pass gate epitaxial layers 131.

The first pass gate transistor region I and the second pass gate transistor region II may include NMOS regions, thus the doped ions in the pass gate doped regions may be N-type ions. To simplify the process steps, the pass gate doped region in the first pass gate transistor region I and the pass gate doped regions in the second pass gate transistor region II may be formed in a same, single step.

The process for forming the pass gate doped regions may include an in-situ doped selective epitaxial process. In one embodiment, the method for forming the pass gate doped regions in the second fin 120 on one side of the gate structure 102 in the first pass gate transistor region I (illustrated as region 'C2' in FIG. 4) and in the third fin 130 on both sides of the gate structure 102 in the second pass gate transistor region II (illustrated as regions 'D1' and 'D2' in FIG. 4) may include: forming the pass gate epitaxial layers 131 in the N-region trench 135, and in-situ self-doping N-type ions during the process for forming the pass gate epitaxial layers 131.

The pass gate epitaxial layers 131 may be made of Si or SiC, etc. Correspondingly, the pass gate doped regions may be made of N-type doped Si or SiC, etc. In one embodiment, the pass gate epitaxial layers 131 may be made of Si, and the N-type ions may be P ions. Therefore, the pass gate doped regions may be made of Si doped with P ions. In other words, the pass gate doped regions may be made of SiP.

The concentration of the P ions in the pass gate doped regions may be dependent on the process requirements. In one embodiment, the concentration of the P ions in the pass gate doped regions may be in a range of approximately $1 \times 10^{20}$ atoms/cm$^3$-$2 \times 10^{21}$ atoms/cm$^3$.

In certain embodiments, after forming the pass gate epitaxial layers, an N-type ions doping process may be performed on the pass gate epitaxial layers to form the pass gate doped regions.

In one embodiment, the top of the pass gate epitaxial layers 131 may be above the top of the N-region trench 135. For example, the top of the pass gate epitaxial layers 131 formed in the N-region trench 135 may be above a top of the fin 120 in the un-etched region 'C1' illustrated in FIG. 4, where the fin 120 has an etched region "C2" to form a portion of the N-region trench 135. Because of the characteristics of the selective epitaxial process, the sidewall surfaces of the pass gate epitaxial layer 131 above the top of the N-region trench 135 in the first pass gate transistor region I may have a vertex that protrudes away from the second fin 120. The sidewall surfaces of the pass gate epitaxial layers 131 above the top of the N-region trench 135 in the second pass gate transistor region II may have a vertex that protrudes away from the third fin 130. In certain embodiments, the top of the pass gate epitaxial layers may be coplanar with the top of the N-region trench.

Figure 10:
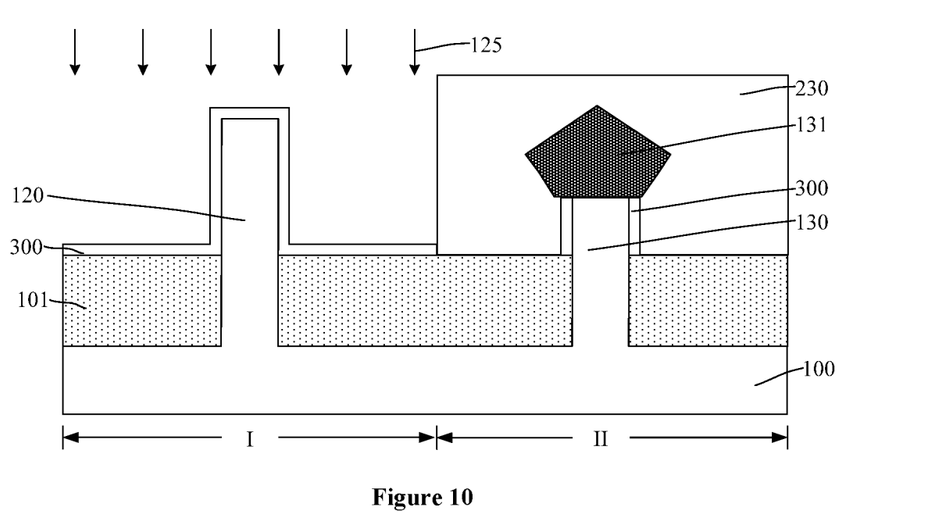
Figure 11:
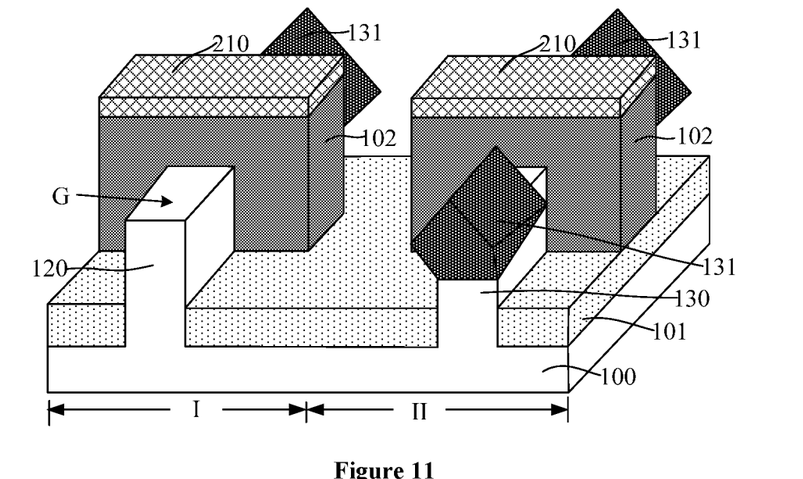

Returning to FIG. 14, after forming the pass gate doped regions on one side of the gate structure in the first pass gate transistor region and in the second pass gate transistor region, a non-epitaxial layer pass gate doped region on the other side of the gate structure in the first pass gate transistor region may be formed (S107). FIGS. 10-11 illustrate a corresponding semiconductor structure.

FIG. 10 illustrates a schematic on the basis of FIG. 8, and FIG. 11 illustrates a perspective view of the semiconductor structure on the basis of FIG. 9 (the N-region mask layer and a second patterned layer not illustrated). Referring to FIGS. 10-11, a second patterned layer 230 may be formed to cover the pass gate doped region on one side of the gate structure 102 in the first pass gate transistor region I (illustrated as region 'C2' in FIG. 4) and the second pass gate transistor region. The N-region mask layer 300 on the top of the second fin 120 on the other side of the gate structure 102 in the first pass gate transistor region I (illustrated as region 'C1' in FIG. 4) may be exposed. An ion doping process 125 may be performed on the second fin 120 on the other side of the gate structure 102 in the first pass gate transistor region I by using the second patterned layer 230 as a mask to form a pass gate doped region in the second fin 120 (illustrated as region 'G' in FIG. 11).

In one embodiment, the second patterned layer 230 may also cover the gate structure 102 and the isolation structure 101 in the first pass gate transistor region I. Further, the second patterned layer 230 may cover regions in the first pass gate transistor region I that are not expected to be exposed.

The first pass gate transistor region I may include an NMOS region, thus doped ions may be N-type ions during the ion doping process 125 performed on the second fin 120 on the other side of the gate structure 102 in the first pass gate transistor region I.

In one embodiment, the process for forming the pass gate doped region by using the ion doping process 125, the non-epitaxial layer process, may include: performing an N-type ions implantation process on the second fin 120 on the other side of the gate structure 102 in the first pass gate transistor region I.

Parameters of the N-type ions implantation process may be dependent on the process requirements. In one embodiment, parameters of the N-type ions implantation process may include the following. Implanted ions may include P ions and As ions, an implantation ion energy may be in a range of approximately 1 KeV-4 KeV, an implantation dose of the P ions may be in a range of approximately $1 \times 10^{15}$ atoms/cm³-$2 \times 10^{15}$ atoms/cm³, and an implantation dose of the As ions may be in a range of approximately $1 \times 10^{15}$ atoms/cm³-$4 \times 10^{15}$ atoms/cm³.

Referring to FIGS. 4-11, the pass gate doped regions (not illustrated) may be formed in the fins on both sides of the gate structure 102 in the pass gate transistor region 'B' as illustrated in FIG. 1. At least one of the pass gate doped regions may be formed by performing an ion-doped non-epitaxial layer process on the fin.

The method for forming the pass gate doped regions by the epitaxial process may affect the contact resistance between the metal silicide and the pass gate doped region, thus the on-current ($I_{on}$) of the formed pass gate transistor may be affected. In one embodiment, in the steps for forming the pass gate doped regions, at least one of the pass gate doped regions may be formed by performing an ion-doped non-epitaxial layer process on the fin. In other words, the epitaxial layer may not be formed in the fin on at least one side of the gate structure 102 in the pass gate transistor region, and an ion implantation process may be performed on the fin on at least one side of the gate structure in the pass gate transistor region. As a result, the contact resistance between the metal silicide and the pass gate doped region may increase and the on-current ($I_{on}$) of the formed pass gate transistor may be reduced.

In one embodiment, to avoid an occurrence of too small on-current ($I_{on}$) of the pass gate transistor, in the steps for forming the pass gate doped region by performing the ion-doped non-epitaxial layer process on the fin, the ion-doped non-epitaxial layer process may be performed on the fin on one side of the gate structure 102 in the pass gate transistor region. As a result, the pass gate doped region 'G' as illustrated in FIG. 11 may be formed in the fin on the one side of the gate structure 102 in the pass gate transistor region.

In various embodiments, the process for forming the pass gate doped region in the fin on the other side of the gate structure 102 in the pass gate transistor region may include: forming a pass gate epitaxial layer 131 as illustrated in FIG. 9 in the fin on the other side of the gate structure in the pass gate transistor region by performing an epitaxial layer process; and forming the pass gate doped region in the pass gate epitaxial layer 131.

The pass gate transistor region may include the first pass gate transistor region I and the second pass gate transistor region II, adjacent to each other along the direction perpendicular to the length direction of the fin. In one embodiment, in the steps of forming the pass gate doped regions in the fins on both sides of the gate structure 102 in the pass gate transistor region, the pass gate doped regions may be formed in the second fin 120 on both sides of the gate structure 102 in the first pass gate transistor region I and in the third fin 130 on both sides of the gate structure 102 in the second pass gate transistor region II. The pass gate transistor region 'G' as illustrated in FIG. 11 on one side of the gate structure 102 in the first pass gate transistor region I may be formed by performing the ion doping process 125, the non-epitaxial layer process, on the second fin 120.

In various embodiments, the process for forming the pass gate doped regions in the second fin 120 on other side of the gate structure 102 in the first pass gate transistor region I (illustrated as region 'C2' in FIG. 4) and in the third fin 130 on both sides of the gate structure 102 in the second pass gate transistor region II (illustrated as regions 'D1' and 'D2' in FIG. 4) may include: performing the epitaxial layer process on the second fin 120 on other side of the gate structure 102 in the first pass gate transistor region I and on the third fin 130 on both sides of the gate structure 102 in the second pass gate transistor region II to form the pass gate doped regions.

In the present disclosure, in the steps for forming the pass gate doped regions in the fins on both sides of the gate structure in the pass gate transistor region, at least one of the pass gate doped regions may be formed by performing an ion-doped non-epitaxial layer process on the fin. In other words, the pass gate epitaxial layer (EPI) may not be formed in the fin on at least one side of the gate structure in the pass gate transistor region. The pass gate epitaxial layer (EPI) may be beneficial for reducing the contact resistance between the subsequently formed metal silicide and the pass gate doped region. In the steps for forming the pass gate doped regions consistent with the disclosed embodiments, at least one of the pass gate doped regions may be formed by performing an ion-doped non-epitaxial layer process on the fin, to increase the contact resistance between the subsequently formed metal silicide and the pass gate doped region, such that the on-current ($I_{on}$) of the formed pass gate transistor may be reduced. Because the beta ratio of the SRAM is inversely proportional to the magnitude of the on-current ($I_{on}$) of the pass gate transistor, the beta ratio of the SRAM in the semiconductor structure consistent with disclosed embodiments may be improved, such that the read margin of the SRAM may be improved, the performance of the SRAM may be improved, and the overall performance of the semiconductor device may be improved.

Figure 12:
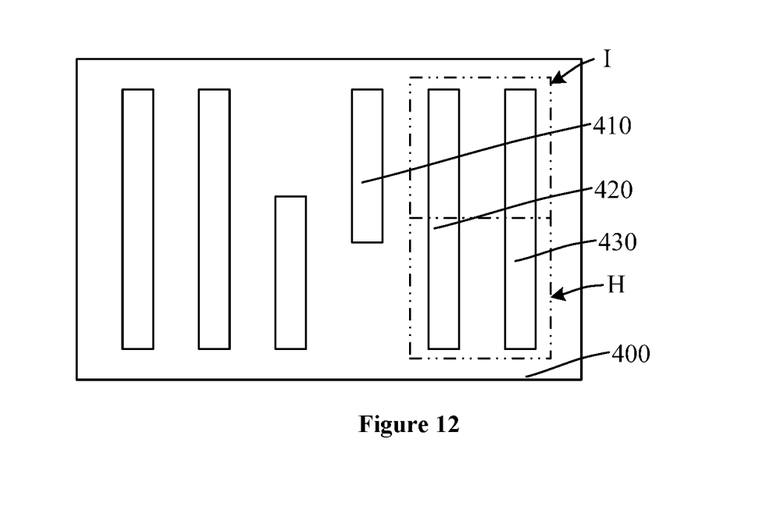
FIGS. 12-13 illustrate an exemplary semiconductor structure consistent with various disclosed embodiments of the present disclosure.
Figure 13:
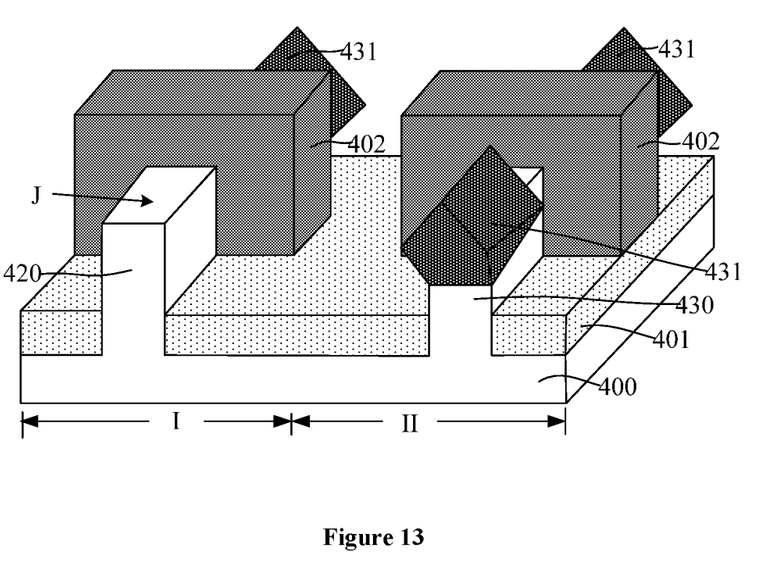

In various embodiments, a semiconductor structure is also provided in the present disclosure. FIGS. 12-13 illustrate a semiconductor structure consistent with the disclosed embodiments. FIG. 12 illustrates a top-view of a portion of the semiconductor structure. FIG. 1 illustrates a substrate and fins. The semiconductor structure may also include other components. FIG. 13 illustrates a perspective-view of region 'H' in FIG. 12.

Referring to FIGS. 12-13, the semiconductor structure may include a base substrate, including a substrate 400 and a plurality of discrete fins (not illustrated) on the substrate 400. The substrate 400 may include a pass gate transistor region 'H' as illustrated in FIG. 12. The semiconductor structure may also include a gate structure 402, across a length portion of each fin, covering portions of top and sidewalls of each fin, and on each fin. In addition, the semiconductor structure may include pass gate doped regions (not illustrated) in the fin on both sides of the gate structure 402 in the pass gate transistor region. At least one pass gate doped region on one side of the gate structure may be a non-epitaxial layer doped region in the fin.

In one embodiment, the semiconductor structure on the base substrate may include a SRAM. Therefore, the substrate 400 may also include a pull-down transistor region I as illustrated in FIG. 12 and a pull-up transistor region (not illustrated).

In one embodiment, the SRAM may include a FinFET. The pull-up transistor region may include a PMOS region, and the pull-down transistor region and the pass gate transistor region may include NMOS regions.

A pass gate transistor may be formed on the substrate 400 in the pass gate transistor region, a pull-down transistor may be formed on the substrate 400 in the pull-down transistor region, and a pull-up transistor may be formed on the substrate 400 in the pull-up transistor region.

In one embodiment, the pass gate transistor and the pull-down transistor may be formed on a same, single fin. Therefore, the pass gate transistor and the pull-down transistor may be adjacent regions along a length portion of the fin.

To improve a device current of the SRAM cell region, the pass gate transistor region may include a first pass gate transistor region I and a second pass gate transistor region II as illustrated in FIG. 13, adjacent to each other along a direction perpendicular to the length direction of fin. A first pass gate transistor may be formed in the first pass gate transistor region I, and a second pass gate transistor may be formed in the second pass gate transistor region II. The first pass gate transistor and the second pass gate transistor may form a parallel pass gate transistor. Both the first pass gate transistor region I and the second pass gate transistor region II may include NMOS regions.

Therefore, in one embodiment, a fin may be formed on the substrate 400 in the first pass gate transistor region I, and another fin may be formed on the substrate 400 in the second pass gate transistor region II.

In one embodiment, the fin formed on the substrate 400 in the pull-up transistor region may be referred to a first fin 410.

The fin formed on the substrate 400 in the first pass gate transistor region I may be referred to a second fin 420. The fin formed on the substrate 400 in the second pass gate transistor region II may be referred to a third fin 430.

Because the pass gate transistor and the pull-down transistor are formed on the same, single fin, the pull-down transistor region may also include a first pull-down transistor region (not illustrated) and a second pull-down transistor region (not illustrated), adjacent to each other along the direction perpendicular to the length direction of the fin. A first pull-down transistor may be formed on the substrate 400 in the first pull-down transistor region, and a second pull-down transistor may be formed on the substrate 400 in the second pull-down transistor region. The first pull-down transistor and the second pull-down transistor may form a parallel pull-down transistor. Both the first pull-down transistor region and the second pull-down transistor region may include NMOS regions.

In one embodiment, along the length direction of the fin, the second fin 420 may be across the first pass gate transistor region I and the first pull-down transistor region, and the third fin 430 may be across the second pass gate transistor region II and the second pull-down transistor region.

In one embodiment, the substrate 400 may be a silicon substrate. In certain embodiments, the substrate may be made of germanium, silicon germanium, silicon carbide, gallium arsenide, or indium gallium. The substrate may also be a silicon on insulator (SOI) substrate, a germanium on insulator (GOI) substrate, a glass substrate, or Group III-V compounds substrates, such as a gallium arsenide (GaAs) substrate, or a gallium nitride (GaN) substrate, etc.

The fins may be made of the same material as the substrate 400. In one embodiment, the fins may be made of silicon. In other words, the first fin 410, the second fin 420, and the third fin 430 may be made of silicon. In certain embodiments, the fins may be made of germanium, silicon germanium, silicon carbide, gallium arsenide, or indium gallium, etc.

Moreover, the semiconductor structure may include an isolation structure 401 formed on the substrate 400 between the adjacent fins. The isolation structure 401 may cover portions of sidewalls of the fins, and top of the isolation structure 401 may be lower than the top of the fins.

The isolation structure 401 serving as an isolation structure of the semiconductor structure may be used to isolate adjacent devices. In one embodiment, the isolation structure 401 may be made of silicon oxide. In certain embodiments, the isolation structure may be made of silicon nitride, or silicon oxynitride, etc.

In one embodiment, the gate structure 402 may be formed on each fin in the pull-up transistor region, the pass gate transistor region, and the pull-down transistor region. For example, the gate structure 402 in the pull-up transistor region may be across a length portion of the first fin 410, and cover portions of the top and sidewalls of the first fin 410. The gate structure 402 in the first pass gate transistor region I and the first pull-down transistor region (not illustrated) may be across a length portion of the second fin 420, and cover portions of the top and sidewalls of the second fin 420. The gate structure 402 in the second pass gate transistor region II and the second pull-down transistor region (not illustrated) may be across a length portion of the third fin 430, and cover portions of the top and sidewalls of the third fin 430.

In certain embodiments, the gate structure may include a gate dielectric layer and a gate electrode layer on the gate dielectric layer. The gate dielectric layer may be made of silicon oxide, or a high-K gate dielectric material, etc. The gate electrode layer may be made of polysilicon or a metal material, including one or more of Ti, Ta, TiN, TaN, TiAl, TiAlN, Cu, Al, W, Ag and Au.

In one embodiment, at least one pass gate doped region on one side of the gate structure may be the non-epitaxial layer doped region formed in the fin. In other words, an epitaxial layer (EPI) may not be formed in the fin on at least one side of the gate structure 402 in the pass gate transistor region, thus the contact resistance between the subsequently formed metal silicide and the pass gate doped region may increase, and the on-current ($I_{on}$) of the pass gate transistor may be reduced.

In one embodiment, to avoid an issue of too small on-current ($I_{on}$) of the pass gate transistor, only the pass gate doped region in the fin on one side of the gate structure 402 in the pass gate transistor region may be the non-epitaxial layer doped region. Correspondingly, the pass gate doped region in the fin on the other side of the gate structure 402 in the pass gate transistor region may be the non-epitaxial layer doped region. In other words, the fin on the other side of the gate structure 402 in the pass gate transistor region may include an epitaxial layer.

The pass gate transistor region may include a first pass gate transistor region I and a second pass gate transistor region II, adjacent to each other along the direction perpendicular to the length direction of fin. Therefore, in one embodiment, the pass gate doped region in the second fin 420 on one side of the gate structure 402 in the first pass gate transistor region I may be the non-epitaxial layer doped region 'J' as illustrated in FIG. 13. The pass gate doped regions in the second fin 420 on the other side of the gate structure 402 in the first pass gate transistor region I, and in the third fin 430 on both sides of the gate structure 402 in the second pass gate transistor region II may be the epitaxial layer doped regions.

Therefore, pass gate epitaxial layers 431 may be formed in the second fin 420 on the other side of the gate structure 402 in the first pass gate transistor region I, and in the third fin 430 on both sides of the gate structure 402 in the second pass gate transistor region II. The pass gate epitaxial layers 431 may be made of Si or SiC, etc.

In one embodiment, the first pass gate transistor region I and the second pass gate transistor region II may include NMOS regions, thus the pass gate doped regions may be doped with N-type ions. In one embodiment, the pass gate doped region serving as the epitaxial layer doped region may be made of SiP.

Concentration of the doped ions in the pass gate doped region serving as the epitaxial layer doped region may be dependent on the process requirements. In one embodiment, the concentration of the P ions in the pass gate doped region may be in a range of approximately $1 \times 10^{20}$ atoms/cm$^3$-$2 \times 10^{21}$ atoms/cm$^3$.

In one embodiment, doped ions of the pass gate doped region serving as the non-epitaxial layer doped region may include P ions and As ions. Concentration of the doped ions in the pass gate doped region serving as the non-epitaxial layer doped region may be dependent on the process requirements. In one embodiment, the concentration of the P ions in the pass gate doped region may be in a range of approximately $1 \times 10^{15}$ atoms/cm$^3$-$2 \times 10^{15}$ atoms/cm$^3$, and the concentration of the As ions in the pass gate doped region may be in a range of approximately $1 \times 10^{15}$ atoms/cm$^3$-$4 \times 10^{15}$ atoms/cm$^3$.

In the present disclosure, the semiconductor structure may include the pass gate doped regions in the fin on both sides of the gate structure in the pass gate transistor region, and at least one of the pass gate doped regions in the fin on one side of the gate structure may be the non-epitaxial layer doped region formed in the fin. In other words, the pass gate epitaxial layer (EPI) may not be formed in the fin on at least one side of the gate structure in the pass gate transistor region. The pass gate epitaxial layer (EPI) may be beneficial for reducing the contact resistance between the metal silicide and the pass gate doped region in the semiconductor structure. In the present disclosure, at least one of the pass gate doped regions in the fin on one side of the gate structure may be the non-epitaxial layer doped region, thus the contact resistance between the metal silicide and the pass gate doped region may increase, and the on-current of the pass gate transistor may be reduced. Because the beta ratio of the SRAM is inversely proportional to the magnitude of the on-current of the pass gate transistor, the beta ratio of the SRAM in the semiconductor structure consistent with disclosed embodiments may be improved, such that the read margin of the SRAM may be improved, the performance of the SRAM may be improved, and the overall performance of the semiconductor device may be improved.

In various embodiments, a SRAM is also provided in the present disclosure. The SRAM may include a semiconductor structure described herein. In the SRAM, at least one of the pass gate doped regions in the fin on one side of the gate structure may be a non-epitaxial layer doped region formed in the fin. In other words, an epitaxial layer may not be formed in the fin on at least one side of the gate structure, thus the on-current of the pass gate transistor in the SRAM may be small. Because the beta ratio of the SRAM is inversely proportional to the magnitude of the on-current of the pass gate transistor, the beta ratio of the SRAM consistent with disclosed embodiments may be improved, such that the read margin of the SRAM may be improved.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A semiconductor structure, comprising:
   a base substrate, including a substrate and a plurality of discrete fins on the substrate, wherein the base substrate includes a pass gate transistor region;
   a gate structure, across a length portion of each fin, covering top and sidewall surfaces of each fin, and on each fin; and
   pass gate doped regions in each fin on both sides of each gate structure in the pass gate transistor region, wherein at least one of the pass gate doped regions on one side of the gate structure is a non-epitaxial layer doped region in a corresponding fin, wherein:
   the at least one of the pass gate doped regions has the non-epitaxial layer doped region on the one side of the gate structure in the corresponding fin, no epitaxial layer doped region is at least on the one side of the gate structure on the corresponding fin, and remaining pass gate doped regions have epitaxial layers on each fin.

2. The semiconductor structure according to claim 1, wherein:
the pass gate transistor region includes an n-channel metal-oxide semiconductor (NMOS) region; and
the pass gate doped regions include N-type ions.

3. The semiconductor structure according to claim 1, wherein:
doped ions in the pass gate doped regions include P ions and As ions;
a doping concentration of the P ions is in a range of approximately $1\times10^{15}$ atoms/cm$^3$-$2\times10^{15}$ atoms/cm$^3$; and
a doping concentration of the As ions is in a range of approximately $1\times10^{15}$ atoms/cm$^3$-$4\times10^{15}$ atoms/cm$^3$.

4. The semiconductor structure according to claim 1, wherein:
the at least one of the pass gate doped regions in the fin on the one side of the gate structure in the pass gate transistor region is the non-epitaxial layer doped region; and
a pass gate doped region in the fin on another side of the gate structure in the pass gate transistor region is an epitaxial layer doped region.

5. The semiconductor structure according to claim 4, wherein:
the epitaxial layer doped region is made of SiP; and
a concentration of the P ions in the pass gate doped region is in a range of approximately $1\times10^{20}$ atoms/cm$^3$-$2\times10^{21}$ atoms/cm$^3$.

6. The semiconductor structure according to claim 1, wherein:
the pass gate transistor region includes a first pass gate transistor region and a second pass gate transistor region, adjacent to each other along a direction perpendicular to a length direction of each fin;
the gate structure in the first pass gate transistor region is across the fin in the first pass gate transistor region, and the gate structure in the second pass gate transistor region is across the fin in the second pass gate transistor region;
the at least one of the pass gate doped regions in the fin on the one side of the gate structure in the first pass gate transistor region is the non-epitaxial layer doped region; and
the pass gate doped regions in the fin on the another side of the gate structure in the first pass gate transistor region and in the fin on both sides of the gate structure in the second pass gate transistor region are epitaxial layer doped regions.

7. A static random access memory (SRAM), comprising:
a semiconductor structure, including:
a base substrate, including a substrate and a plurality of discrete fins on the substrate, wherein the base substrate includes a pass gate transistor region;
a gate structure, across a length portion of each fin, covering top and sidewall surfaces of each fin, and on each fin; and
pass gate doped regions in each fin on both sides of each gate structure in the pass gate transistor region, wherein at least one of the pass gate doped regions on one side of the gate structure is a non-epitaxial layer doped region in-a corresponding fin, wherein:
the at least one of the pass gate doped regions has the non-epitaxial layer doped region on the one side of the gate structure in the corresponding fin, no epitaxial layer doped region is at least on the one side of the gate structure on the corresponding fin, and remaining pass gate doped regions have epitaxial layers on each fin.

8. The static random access memory (SRAM) according to claim 7, wherein:
the at least one of the pass gate doped regions in the fin on the one side of the gate structure in the pass gate transistor region is the non-epitaxial layer doped region; and
a pass gate doped region in the fin on the another side of the gate structure in the pass gate transistor region is an epitaxial layer doped region.

9. The static random access memory (SRAM) according to claim 8, wherein:
the epitaxial layer doped region is made of SiP; and
a concentration of the P ions in the pass gate doped region is in a range of approximately $1\times10^{20}$ atoms/cm$^3$-$2\times10^{21}$ atoms/cm$^3$.

10. The static random access memory (SRAM) according to claim 7,
wherein:
the pass gate transistor region includes a first pass gate transistor region and a second pass gate transistor region, adjacent to each other along a direction perpendicular to a length direction of each fin;
the gate structure in the first pass gate transistor region is across the fin in the first pass gate transistor region, and the gate structure in the second pass gate transistor region is across the fin in the second pass gate transistor region;
the at least one of the pass gate doped regions in the fin on the one side of the gate structure in the first pass gate transistor region is the non-epitaxial layer doped region; and
the pass gate doped regions in the fin on the another side of the gate structure in the first pass gate transistor region and in the fin on both sides of the gate structure in the second pass gate transistor region are epitaxial layer doped regions.

11. The static random access memory (SRAM) according to claim 7, wherein:
the pass gate transistor region includes an NMOS region; and
the pass gate doped regions include N-type ions.

12. The static random access memory (SRAM) according to claim 7, wherein:
doped ions in the pass gate doped regions include P ions and As ions;
a doping concentration of the P ions is in a range of approximately $1\times10^{15}$ atoms/cm$^3$-$2\times10^{15}$ atoms/cm$^3$; and
a doping concentration of the As ions is in a range of approximately $1\times10^{15}$ atoms/cm$^3$-$4\times10^{15}$ atoms/cm$^3$.

* * * * *